(12) United States Patent
Lanham et al.

(10) Patent No.: US 9,217,664 B2
(45) Date of Patent: Dec. 22, 2015

(54) VIBRATING METER INCLUDING AN IMPROVED METER CASE

(75) Inventors: Gregory Treat Lanham, Longmont, CO (US); Christopher A. Werbach, Longmont, CO (US); Anthony William Pankratz, Arvada, CO (US)

(73) Assignee: Micro Motion, Inc., Boulder, CO (US)

( * ) Notice: Subject to any disclaimer, the term of this patent is extended or adjusted under 35 U.S.C. 154(b) by 365 days.

(21) Appl. No.: 13/704,154

(22) PCT Filed: Jul. 9, 2010

(86) PCT No.: PCT/US2010/041483
§ 371 (c)(1),
(2), (4) Date: Dec. 13, 2012

(87) PCT Pub. No.: WO2012/005735
PCT Pub. Date: Jan. 12, 2012

(65) Prior Publication Data
US 2013/0086986 A1 Apr. 11, 2013

(51) Int. Cl.
*G01F 1/84* (2006.01)
*G01H 17/00* (2006.01)
*G01F 15/00* (2006.01)
*G01F 15/14* (2006.01)
*H05K 13/00* (2006.01)

(52) U.S. Cl.
CPC ............. *G01H 17/00* (2013.01); *G01F 1/8409* (2013.01); *G01F 1/8413* (2013.01); *G01F 1/8477* (2013.01); *G01F 15/006* (2013.01); *G01F 15/14* (2013.01); *H05K 13/00* (2013.01); *Y10T 29/49117* (2015.01); *Y10T 29/49826* (2015.01)

(58) Field of Classification Search
CPC .......................... G01F 1/8409; G01F 1/8413
USPC .................................. 73/32 A, 861.355, 431
See application file for complete search history.

(56) References Cited

U.S. PATENT DOCUMENTS

| | | | |
|---|---|---|---|
| 4,315,432 A * | 2/1982 | Newton | 73/431 |
| 4,831,885 A | 5/1989 | Dahlin | |
| 4,895,031 A | 1/1990 | Cage | |
| 6,223,605 B1 | 5/2001 | Koudal et al. | |
| 7,971,494 B2 * | 7/2011 | Hussain et al. | 73/861.355 |
| 2004/0045369 A1 * | 3/2004 | Bitto et al. | 73/861.18 |

FOREIGN PATENT DOCUMENTS

| | | |
|---|---|---|
| DE | 3824351 A1 | 1/1990 |
| EP | 0871017 A1 | 10/1998 |
| JP | 07174601 A | 7/1995 |
| WO | 0047957 A1 | 8/2000 |

(Continued)

*Primary Examiner* — John Chapman, Jr.
(74) *Attorney, Agent, or Firm* — The Ollila Law Group LLC

(57) ABSTRACT

A vibrating meter is provided. The vibrating meter includes one or more conduits formed from a first material. The vibrating meter further includes a driver coupled to a conduit of the one or more conduits and configured to vibrate at least a portion of the conduit at one or more drive frequencies and one or more pick-offs coupled to a conduit of the one or more conduits and configured to detect a motion of the vibrating portion of the conduit. The vibrating meter further includes a case enclosing at least a portion of the one or more conduits, the driver and the one or more pick-offs. The case is formed from a second material comprising a higher vibrational damping characteristic than the first material.

19 Claims, 8 Drawing Sheets

(56) References Cited

FOREIGN PATENT DOCUMENTS

| | | | |
|---|---|---|---|
| WO | 02052230 A1 | 7/2002 |
| WO | 2006056518 A2 | 6/2006 |
| WO | 2006118557 A1 | 11/2006 |

* cited by examiner

VIBRATING METER INCLUDING AN IMPROVED METER CASE

TECHNICAL FIELD

The present invention relates to, vibrating meters, and more particularly, to a vibrating meter with an improved meter case.

BACKGROUND OF THE INVENTION

Vibrating meters such as, for example, densitometers, volumetric flow meters, and Coriolis flow meters are used for measuring one or more characteristics of substances, such as, for example, density, mass flow rate, volume flow rate, totalized mass flow, temperature, and other information. Vibrating meters include one or more conduits, which may have a variety of shapes, such as, for example, straight, U-shaped, or irregular configurations.

The one or more conduits have a set of natural vibration modes, including, for example, simple bending, torsional, radial, and coupled modes. The one or more conduits are vibrated by at least one driver at a resonance frequency in one of these modes, hereinafter referred to as the drive mode, for purposes of determining a characteristic of the substance. One or more meter electronics transmit a sinusoidal driver signal to the at least one driver, which is typically a magnet/coil combination, with the magnet typically being affixed to the conduit and the coil being affixed to a mounting structure or to another conduit. The driver signal causes the driver to vibrate the one or more conduits at the drive frequency in the drive mode. For example, the driver signal may be a periodic electrical current transmitted to the coil.

One or more pick-offs detect the motion of the conduit(s) and generate a pick-off signal representative of the motion of the vibrating conduit(s). The pick-off is typically a magnet/coil combination, with the magnet typically being affixed to one conduit and the coil being affixed to a mounting structure or to another conduit. The pick-off signal is transmitted to the one or more electronics; and according to well-known principles, the pick-off signal may be used by the one or more electronics to determine a characteristic of the substance or to adjust the driver signal, if necessary.

Typically, in addition to the conduits, vibrating meters are also provided with one or more meter components, such as a case, a base, flanges, etc. While essentially all of the additional meter components can create measurement problems due to various vibrational characteristics, the vibrational characteristics of the case are typically most prevalent and cause the most significant measurement problems. Therefore, although the case is the focus of the discussion that follows, similar vibrational problems and solutions are applicable to other meter components. The measurement problems caused by various meter components is due to the difficulty in differentiating vibrations associated with the conduits from vibrations associated with the meter component, such as the case. One reason for the difficulty is that similar to the conduits, the case also has one or more natural modes of vibration, including for example, simple bending, torsional, radial, and lateral modes. The particular frequency that induces a mode of vibration generally depends on a number of factors such as the material used to form the case, the thickness of the case, temperature, pressure, etc. Vibrational forces generated by the driver or from other sources in the material processing system, such as pumps, may cause the case to vibrate in one of the natural modes. It is difficult to generate an accurate measurement of a characteristic of the substance in situations where the frequency used to drive the one or more conduits in the drive mode corresponds to a frequency that causes the case to vibrate in one of its natural modes of vibration. The vibrational modes of the case can interfere with the vibration of the conduits leading to erroneous measurements.

There have been numerous prior art attempts to separate the frequencies that induce the case's vibrational mode from the conduits' vibrational mode. These frequencies may comprise the natural resonance frequencies of the various vibrational modes of the case and the fluid filled conduits. For example, the case can be made extremely stiff and/or massive in order to decrease the frequencies that induce the various vibrational modes away from the anticipated drive mode of the conduits. Both of these options have serious drawbacks. Increasing the mass and/or stiffness of the case results in complex and difficult manufacturing, this adds cost and makes mounting the vibrating meter difficult. One specific prior art approach to increasing the mass of the case has been to weld metal weights to an existing case. This approach does not adequately dissipate vibrational energy in order to reduce the case's resonant frequencies. Further, this approach is often costly and produces an unsightly case.

One reason for the overlap between the drive frequency and the frequencies that induce a vibrational mode in the case is that the conduits and the case are typically formed from similar materials, i.e., both are formed from metal. While metal cases provide a number of advantages such as increased strength, explosion proof ratings, etc., metal cases add a significant cost to manufacturing a vibrating meter. A significant cost associated with the metal case is due to the required welding of the case. Additionally, a significant amount of time and/or cost is spent on adequately separating the frequencies that induce modes of vibration in the case from the drive frequency. The added mass or thickness of the case requires not only additional material but also additional time to assemble. Therefore, the use of a metal case with metal conduits has a number of drawbacks.

The present invention overcomes these and other problems and an advance in the art is achieved. The present invention provides a vibrating meter with an improved meter case. The meter case is formed from a high-damping material. The resonant frequencies of the meter case are reduced and separated away from the resonant frequencies of the conduits. Consequently, the risk of the drive mode of the vibrating meter inducing a mode of vibration in the meter case is substantially reduced. Furthermore, the cost associated with weld joints is substantially eliminated by the meter case of the present invention.

SUMMARY OF THE INVENTION

A vibrating meter is provided according to an embodiment of the invention. The vibrating meter includes one or more conduits formed from a first material. The vibrating meter further includes a driver coupled to a conduit of the one or more conduits and configured to vibrate at least a portion of the conduit at one or more drive frequencies and one or more pick-offs coupled to a conduit of the one or more conduits and configured to detect a motion of the vibrating portion of the conduit. According to an embodiment of the invention, the vibrating meter further includes a case enclosing at least a portion of the one or more conduits, the driver and the one or more pick-offs and formed from a second material comprising a higher vibrational damping characteristic than the first material.

A method of forming a vibrating meter including one or more conduits formed from a first material is provided according to an embodiment of the invention. The method comprises steps of coupling a driver to a conduit of the one or more conduits, the driver being configured to vibrate at least a portion of the conduit at one or more drive frequencies and coupling one or more pick-offs to a conduit of the one or more conduits, the one or more pick-offs being configured to detect a motion of the vibrating portion of the conduit. According to an embodiment of the invention, the method further comprises a step of enclosing at least a portion of the one or more conduits, the driver, and the one or more pick-offs with a case formed from a second material comprising a higher vibrational damping characteristic than the first material.

ASPECTS

According to an aspect of the invention, a vibrating meter comprises:
one or more conduits formed from a first material;
a driver coupled to a conduit of the one or more conduits and configured to vibrate at least a portion of the conduit at one or more drive frequencies;
one or more pick-offs coupled to a conduit of the one or more conduits and configured to detect a motion of the vibrating portion of the conduit; and
a case enclosing at least a portion of the one or more conduits, the driver and the one or more pick-offs and formed from a second material comprising a higher vibrational damping characteristic than the first material.

Preferably, the case further comprises a plurality of ribs.

Preferably, the vibrating meter further comprises a conduit opening.

Preferably, the case further comprises a feed thru opening for one or more electrical leads.

Preferably, the vibrating meter further comprises a base coupled to the case, wherein the base is formed from the second material.

Preferably, the first material is a metal and the second material is a plastic.

Preferably, the vibrating meter further comprises one or more manifolds coupled to the one or more conduits and one or more manifold openings formed in the case and adapted to receive the one or more manifolds.

Preferably, the vibrating meter further comprises a groove formed in each of the one or more manifold openings and configured to receive a sealing member coupled to each of the one or more manifolds.

Preferably, the vibrating meter further comprises a rupture point formed in the case and adapted to fail at a predetermined pressure.

Preferably, at least a portion of the vibrating meter is transparent.

According to another aspect of the invention, a method of forming a vibrating meter including one or more conduits formed from a first material comprises steps of:
coupling a driver to a conduit of the one or more conduits, the driver being configured to vibrate at least a portion of the conduit at one or more drive frequencies;
coupling one or more pick-offs to a conduit of the one or more conduits, the one or more pick-offs being configured to detect a motion of the vibrating portion of the conduit; and
enclosing at least a portion of the one or more conduits, the driver, and the one or more pick-offs with a case formed from a second material comprising a higher vibrational damping characteristic than the first material.

Preferably, the method further comprises a step of forming a plurality of ribs in the case.

Preferably, the method further comprises a step of defining a conduit opening.

Preferably, the method further comprises a step of forming a feed thru opening for one or more electrical leads in the case.

Preferably, the method further comprises steps of coupling a base to the case, wherein the base is formed from the second material.

Preferably, the first material is a metal and the second material is a plastic.

Preferably, the case includes one or more manifold openings adapted to receive one or more manifolds coupled to the one or more conduits and the method further comprises steps of coupling a sealing member to each of the manifolds and inserting a sealing member into a groove formed in each of the manifold openings formed in the case.

Preferably, the method further comprises a step of forming a rupture point in the case that is adapted to fail at a predetermined pressure.

Preferably, the method further comprises a step of forming at least a portion of the case transparent.

DETAILED DESCRIPTION OF THE INVENTION

FIGS. 1-7b and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
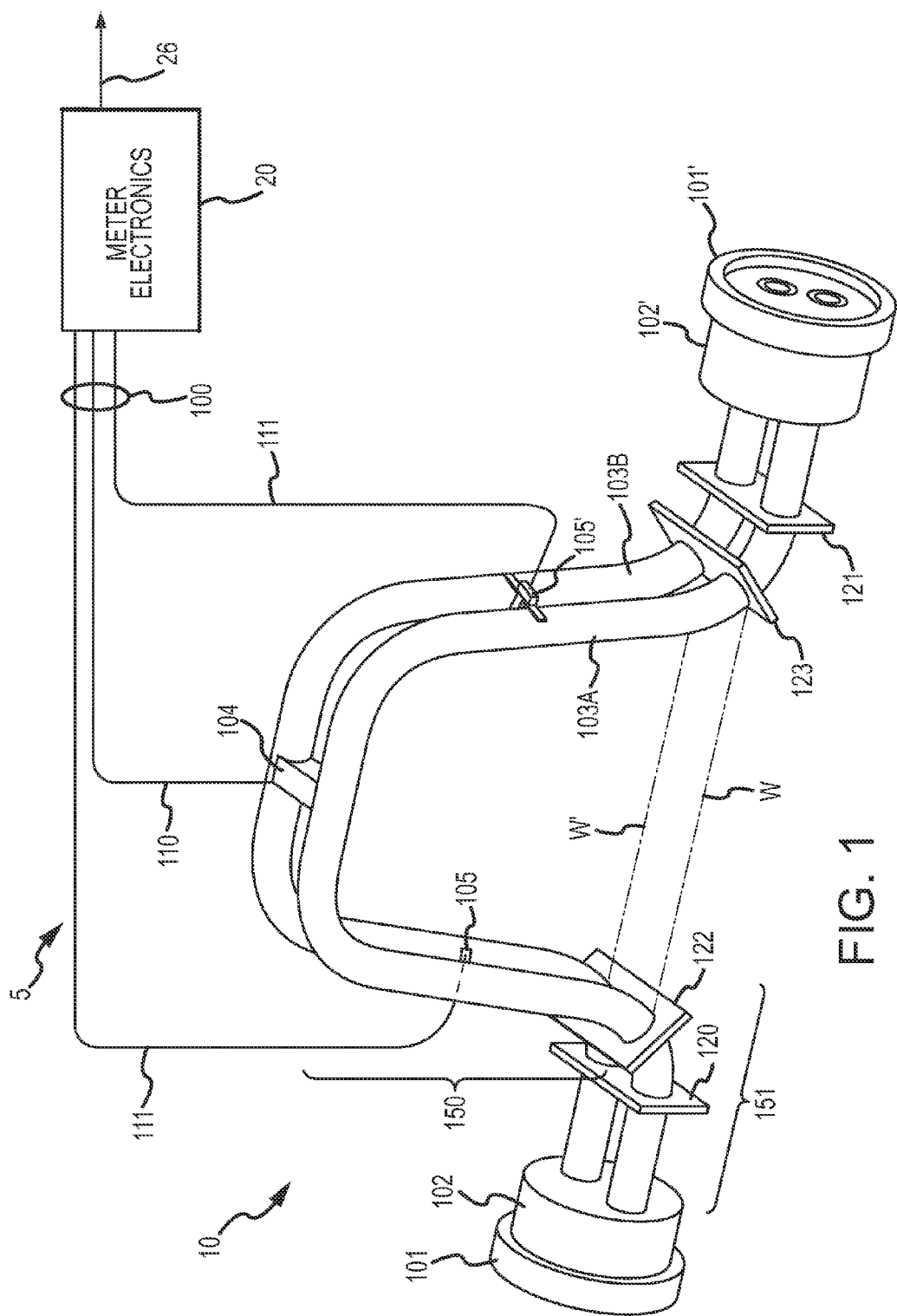
FIG. 1 shows a vibrating meter according to an embodiment of the invention.

FIG. 1 shows a vibrating meter 5 in the form of a meter comprising a sensor assembly 10 and one or more meter electronics 20. The vibrating meter 5 may comprise a Coriolis flow meter, an ultrasonic flow meter, a volumetric flow meter, a densitometer, etc. The meter electronics 20 is connected to the sensor assembly 10 via leads 100 to measure a characteristic of a substance, such as, for example, a fluid density, a mass flow rate, a volume flow rate, totalized mass flow, temperature, and other information over path 26.

The sensor assembly 10 of the present example includes a pair of flanges 101, 101'; manifolds 102, 102'; a driver 104; pick-offs 105, 105'; and conduits 103A, 103B. The driver 104 and pick-offs 105, 105' are coupled to conduits 103A and 103B. The driver 104 is shown affixed to conduits 103A, 103B in a position where the driver 104 can vibrate a vibrating portion 150 of the conduits 103A, 103B in a drive mode. The vibrating portions 150 of the conduits 103A, 103B vibrate about bending axes W, W', respectively. The bending axes W, W' are at least partially defined by brace bars 120-123 coupled to the conduits 103A, 103B. It should be appreciated that there may be other portions of the conduits 103A, 103B that do not vibrate or vibrate undesirably. These so-called "non-vibrating" portions 151 of the conduits 103A, 103B is the portion generally below the upper brace bars 122, 123, for example. It should be appreciated that only one vibrating portion 150 and one non-vibrating portion 151 is outlined. However, because the conduits 103A, 103B are substantially parallel to one another, the portion of the conduit 103A that vibrates is substantially identical to the portion of conduit 103B that vibrates. Similarly, the non-vibrating portion of conduit 103A is substantially identical to the non-vibrating portion of conduit 103B. Likewise, the non-vibrating portion 151 is only identified at the inlet end of the conduits 103A, 103B; however, the outlet portions below the outlet brace bars 123, 121 are similarly non-vibrating portions of the conduits 103A, 103B.

The pick-offs 105, 105' are affixed to conduits 103A, 103B in order to detect motion of the vibrating portion 150 of the conduits 103A, 103B. Therefore, in vibrating meters, the vibration of the vibrating portion 150 of the conduits 103A, 103B is of interest. For purposes of the description that follows, components of the vibrating meter 5 exclusive of the vibrating portion 150 of the conduits 103A, 103B, the driver 104, and the pick-offs 105, 105' can be grouped as meter components that may also vibrate undesirably and interfere with the vibration of the conduits 103A, 103B.

It should be appreciated to those skilled in the art that it is within the scope of the present invention to use the principles discussed herein in conjunction with any type of vibrating meter, including vibrating meters that lack the measurement capabilities of a Coriolis flow meter. Examples of such devices include, but are not limited to, vibrating densitometers, volumetric flow meters, etc.

Flanges 101, 101' of the present example are coupled to manifolds 102, 102'. Manifolds 102, 102' of the present example are affixed to opposite ends of the conduits 103A, 103B. When the sensor assembly 10 is inserted into a pipeline system (not shown) which carries the substance, the substance enters sensor assembly 10 through the flange 101, passes through the inlet manifold 102 where the total amount of material is directed to enter the conduits 103A, 103B, flows through the conduits 103A, 103B, and back into outlet manifold 102' where it exits the sensor assembly 10 through the flange 101'.

As mentioned above, the conduits 103A, 103B can be driven by the driver 104 in a drive mode. According to an embodiment of the invention, the drive mode may be, for example, the first out of phase bending mode and the conduits 103A and 103B may be selected and appropriately mounted to the inlet manifold 102 and the outlet manifold 102' so as to have substantially the same mass distribution, moments of inertia, and elastic modules about the bending axes W and W', respectively. As shown, the conduits 103A, 103B extend outwardly from the manifolds 102, 102' in an essentially parallel fashion. Although the conduits 103A, 103B are shown provided with a generally U-shape, it is within the scope of the present invention to provide the conduits 103A, 103B with other shapes, such as, for example, straight or irregular shapes. Furthermore, it is within the scope of the present invention to utilize modes other than the first out of phase bending mode as the drive mode.

In the present example, where the drive mode comprises the first out of phase bending mode, the vibrating portion 150 of the conduits 103A, 103B may be driven by the driver 104 at the resonance frequency of the first out of phase bending mode in opposite directions about their respective bending axes W and W'. The driver 104 may comprise one of many well-known arrangements, such as a magnet mounted to the conduit 103A and an opposing coil mounted to the conduit 103B. An alternating current can be passed through the opposing coil to cause both conduits 103A, 103B to oscillate. A suitable drive signal can be applied by one or more meter electronics 20, via lead 110 to the driver 104. It should be appreciated that while the discussion is directed towards two conduits 103A, 103B, in other embodiments, only a single conduit may be provided.

According to an embodiment of the invention, the one or more meter electronics 20 produces a drive signal and transmits it to the driver 104 via lead 110, which causes the driver 104 to oscillate the vibrating portion 150 of the conduits 103A, 103B. It is within the scope of the present invention to produce multiple drive signals for multiple drivers. One or more meter electronics 20 can process the left and right velocity signals from the pick-offs 105, 105' to compute a characteristic of a substance, such as, for example, mass flow rate. The path 26 provides an input and an output means that allows the one or more meter electronics 20 to interface with an operator as is generally known in the art. An explanation of the circuitry of the one or more meter electronics 20 is not needed to understand the present invention and is omitted for brevity of this description. It should be appreciated that the description of FIG. 1 is provided merely as an example of the operation of one possible vibrating meter and is not intended to limit the teaching of the present invention.

Figure 2:
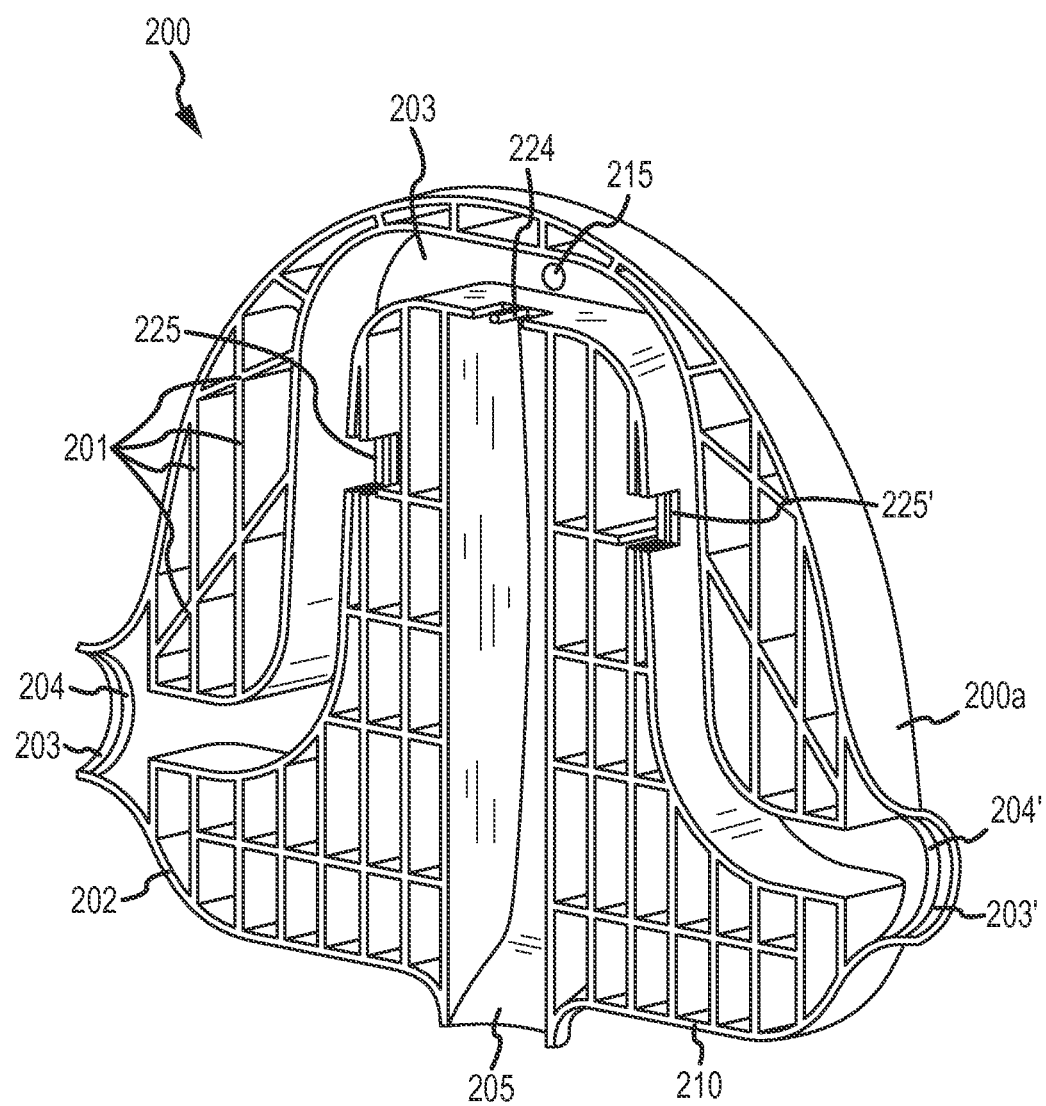
FIG. 2 shows a portion of a case for the vibrating meter according to an embodiment of the invention.

FIG. 2 shows a cross-sectional view of a portion of a case 200 for the vibrating meter 5 according to an embodiment of the invention. The case 200 may be provided in two or more portions and glued, snap-fit, welded, brazed or otherwise coupled once in place. For example, FIG. 2 shows only one portion 200a of the case 200. Once assembled, a second corresponding portion of the case 200 could be coupled to the first portion 200a to substantially enclose at least a portion of the sensor assembly 10. In some embodiments, the two portions of the case 200 may be coupled only along a perimeter portion, designated generally by 210. Alternatively, the two or more portions may be coupled in multiple locations. The case 200 can be provided to enclose at least a portion of the conduits 103A, 103B, the driver 104, and the pick-offs 105, 105' (See FIG. 3). As can be appreciated, the case 200 can protect the conduits 103A, 103B, the driver 104, and the pick-offs 105, 105' as is generally known in the art.

While prior art cases are susceptible to vibrate in one or more vibrational modes due to an overlap between the drive mode and a resonant frequency of the case, the case 200 of the present invention is formed from a material with resonant frequencies required to induce a mode of vibration substantially reduced and separated away from the drive mode frequency. According to an embodiment of the invention, the resonant frequencies of the case 200 are substantially separated from the drive mode frequency by providing conduits 103A, 103B formed from a first material and forming the case 200 from a second material, wherein the second material exhibits higher vibrational damping characteristics than the first material. As is known in the art, vibrational damping is the conversion of mechanical energy (vibrations) into thermal energy. The heat generated due to damping is lost from the mechanical system into the surrounding environment. While damping can be characterized in a number of different ways, one specific vibrational damping characteristic is a so-called damping loss factor, η. A component's damping loss factor, η, can be expressed as follows:

$$\eta = \frac{D}{2\pi W} \quad (1)$$

Where:
η is the damping loss factor;
D is the energy dissipated per unit volume per cycle; and
W is the maximum strain energy stored during a cycle.

As can be appreciated, a higher damping loss factor is realized in materials having a greater dissipated energy per unit volume per cycle or a lower maximum strain energy stored during a cycle. Damping loss factors for a wide variety of materials are available in look-up tables, charts, graphs, etc. Alternatively, the damping loss factor of a specific material may be determined experimentally. Therefore, the first and second materials can be chosen such that the first material comprises a lower damping loss factor than the second material. Examples of such materials are metals and plastics/polymers. In general, most metals have a damping loss factor in the range of approximately 0.001. In contrast, plastics/polymers having a damping loss factor in the range of 0.01-2.0. Therefore, by selecting a metal for the first material and a plastic/polymer for the second material, the second material can exhibit a vibrational damping characteristic between 10 and 2000 times higher than the vibrational damping characteristic for the first material. One cause of the increase in the damping loss factor is because plastics/polymers experience viscoelastic damping as well as frictional losses due to the interface between the fibers and polymers. In contrast, most metals only experience viscoelastic damping at much less levels compared to plastics/polymers.

Figure 7A:
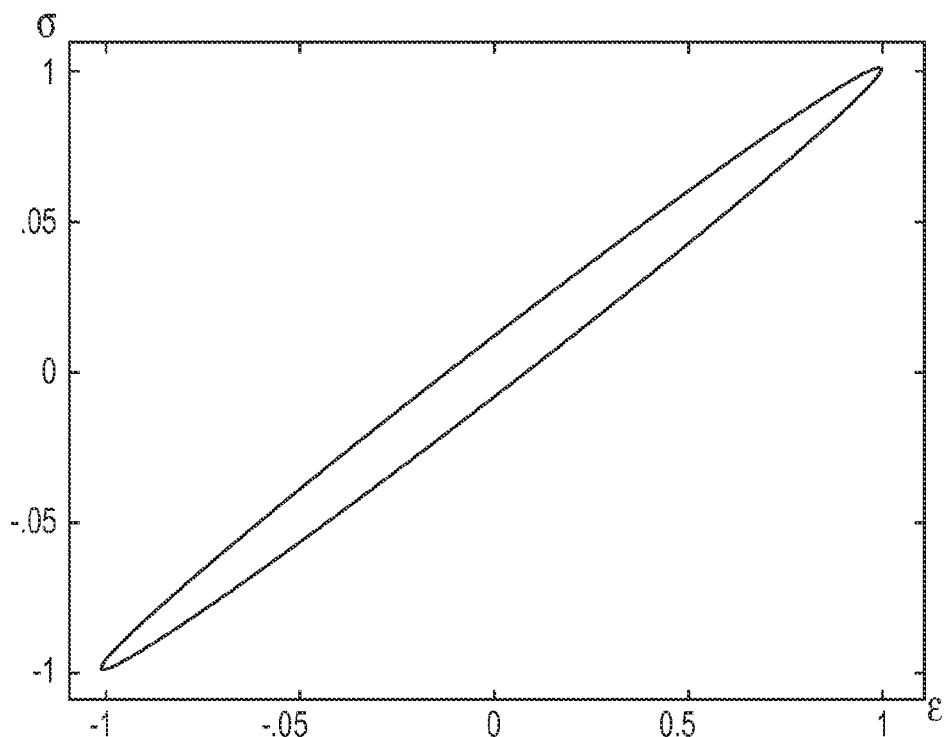
FIG. 7a shows a hysteresis diagram for a metal.
Figure 7B:
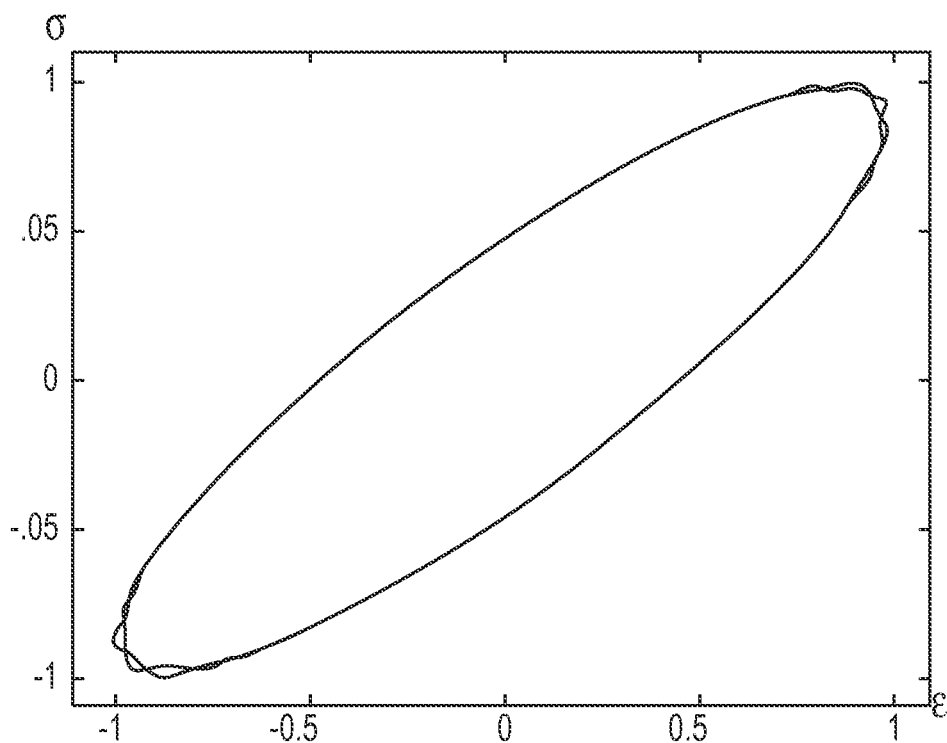
FIG. 7b shows a hysteresis diagram for a plastic.

The differing vibrational damping characteristics between the first and second materials is further illustrated in FIGS. 7a & 7b. FIG. 7a shows a hysteresis diagram of input stress versus the responding strain for one vibration cycle for the first material. The area contained within the ellipse is equal to the dissipated energy per cycle, which is related to the damping loss factor, η discussed above. FIG. 7b shows a hysteresis diagram of the input stress versus the responding strain for one vibration cycled for the second material. As can be seen by a comparison between the two diagrams, the area contained within the ellipse for the second material shown in FIG. 7b is much larger than the area contained within the ellipse for the first material shown in FIG. 7a. Therefore, the diagrams illustrate that the second material has a higher vibrational damping characteristic than the first material. Therefore, if the first and second materials were subjected to substantially the same imparted vibrational energy, the first material would comprise a higher vibrational velocity than the second material because the second material comprises higher vibrational damping characteristics. Therefore, the resonant frequency peak of the first material would be greater than the resonant frequency peak of the second material.

According to an embodiment of the invention, the vibrating portion 150 of the conduits 103A, 103B are formed from a metal, for example. This is typical in the art and many times, the metal used to form the conduits 103A, 103B is titanium due to the superior corrosion resistance and thermal properties. In some embodiments, it may not be practical to couple the first and second materials together with a fluid-tight seal. Therefore, the entirety of the conduits 103A, 103B may be formed from the first material.

According to an embodiment of the invention, when the conduits 103A, 103B are formed from a metal, the case 200 can be formed from a plastic, for example. As discussed above, plastic exhibits much higher vibrational damping characteristics, for example, a higher damping loss factor, than metal and therefore, frequencies required to induce a vibration mode in the case 200 are substantially reduced while the frequencies required to induce a vibration mode in the conduits 103A, 103B remain substantially unaffected. It should be appreciated that the specific materials used for the conduits 103A, 103B and the case 200 are merely examples and should in no way limit the scope of the present invention. However, it should be appreciated that according to an embodiment of the invention, the conduits 103A, 103B are made from a first material while the case 200 is made from a second material, where the second material has higher vibrational damping characteristics than the first material. Other examples of materials with vibrational damping characteristics higher than metal are rubber, carbon fiber, fiberglass, graphite, glass, wood, etc. This list is not exhaustive and those skilled in the art will readily recognize other suitable materials that exhibit higher vibrational damping characteristics that can be used for the case 200.

According to an embodiment of the invention, when the case 200 is formed from plastic, welding that is typically required with metal cases can be substantially eliminated. In the embodiment shown, a second portion 200b of the case 200 (See FIG. 5) can be coupled to the first portion 200a of the case 200 that is shown in FIG. 2 using an adhesive, epoxy, mechanical fasteners, snap-fit, etc. By avoiding the need to weld the case portions together as well as weld the case to a base, for example, the cost and complexity associated with assembling the case 200 around the remainder of the sensor assembly 10 is substantially reduced.

According to an embodiment of the invention, the second material used to form the case 200 may not be as strong as metal, which is typically used in the prior art. Therefore, the present invention implements a number of additional features in the case 200 in order to overcome various drawbacks typically associated with weaker materials, such as plastic. In the embodiment shown in FIG. 2, the case 200 includes a plurality of ribs 201. The ribs 201 may be provided to strengthen the case 200 while maintaining a reduced weight. The ribs 201 may be added to the case 200 by coupling the ribs 201 to an existing shell 202. Alternatively, the case 200 may be molded as is generally known in the art and the ribs 201 may be formed at the same time as forming the shell 202 during the molding process. In some embodiments, the ribs 201 may be provided to adjust the frequencies required to induce a vibrational mode in the case 200. For example, by increasing the number of ribs 201 in the case 200 and/or the spacing between the ribs 201, the rigidity of the case 200 may increase, thereby increasing the damping of the case 200 to further reduce the frequencies required to induce a mode of vibration in the case 200.

According to an embodiment of the invention, the case 200 can further include a conduit opening 203. According to an embodiment of the invention, the conduit opening 203 is defined by the plurality of ribs 201. The conduit opening 203 may be sized and shaped to accept the conduits 103A, 103B, for example. According to an embodiment of the invention, the conduit opening 203 may comprise an area substantially equal to the area required by the conduits 103A, 103B while vibrating at maximum vibrational amplitude in order to minimize pressure piling that is possible in prior art cases that provide a much larger open volume around the conduits than necessary. In contrast, with the conduit opening 203 substantially surrounding the conduits 103A, 103B, the case 200 may substantially reduce the risk of the case 200 exploding in the event of a conduit failure.

In addition to the conduit opening 203, the case 200 may include first and second manifold openings 203, 203' adapted to receive the first and second manifolds 102, 102' of the sensor assembly 10. The manifold openings 203, 203' may further include grooves 204, 204' adapted to receive a sealing member 304, 304', such as an O-ring, for example (See FIG. 3).

According to an embodiment of the invention, the case 200 further includes a feed thru opening 205. The feed thru opening 205 can be provided for the leads 100 communicating between the driver 104, the pick-offs 105, 105', and the meter electronics 20. Although the feed thru opening 205 is shown as exiting the case 200 near the bottom portion, it should be appreciated that the feed thru opening 205 could exit the case 200 at any desired location and the particular location shown should in no way limit the scope of the present invention.

According to an embodiment of the invention, the case 200 may further include a driver mount 224, and pick-off mounts 225, 225'. The driver 224 and pick-off mounts 225, 225' may be provided in embodiments where the case 200 is used with a single-conduit vibrating meter. Therefore, the case 200 can provide the substantially stationary mount against which the single conduit vibrates. Advantageously, a separate stationary plate or mount is not required.

The case 200 may provide an explosion-proof barrier. According to an embodiment of the invention, the case 200 may include an explosion rupture point 215, which is designed to fail at a predetermined pressure in order to safely exhaust the case 200 in a specific direction. The predetermined pressure at which the explosion rupture point 215 is designed to fail may be lower than the pressure the remainder of the case 200 can safely contain. The explosion rupture point 215 may comprise an area of the case 200 with reduced thickness, for example. The explosion rupture point 215 may be formed during a molding process or may be cut out after the case 200 is formed. While the explosion rupture point 215 is shown near the top of the case 200, it should be appreciated that the explosion rupture point 215 may be located at any desired position.

Figure 3:
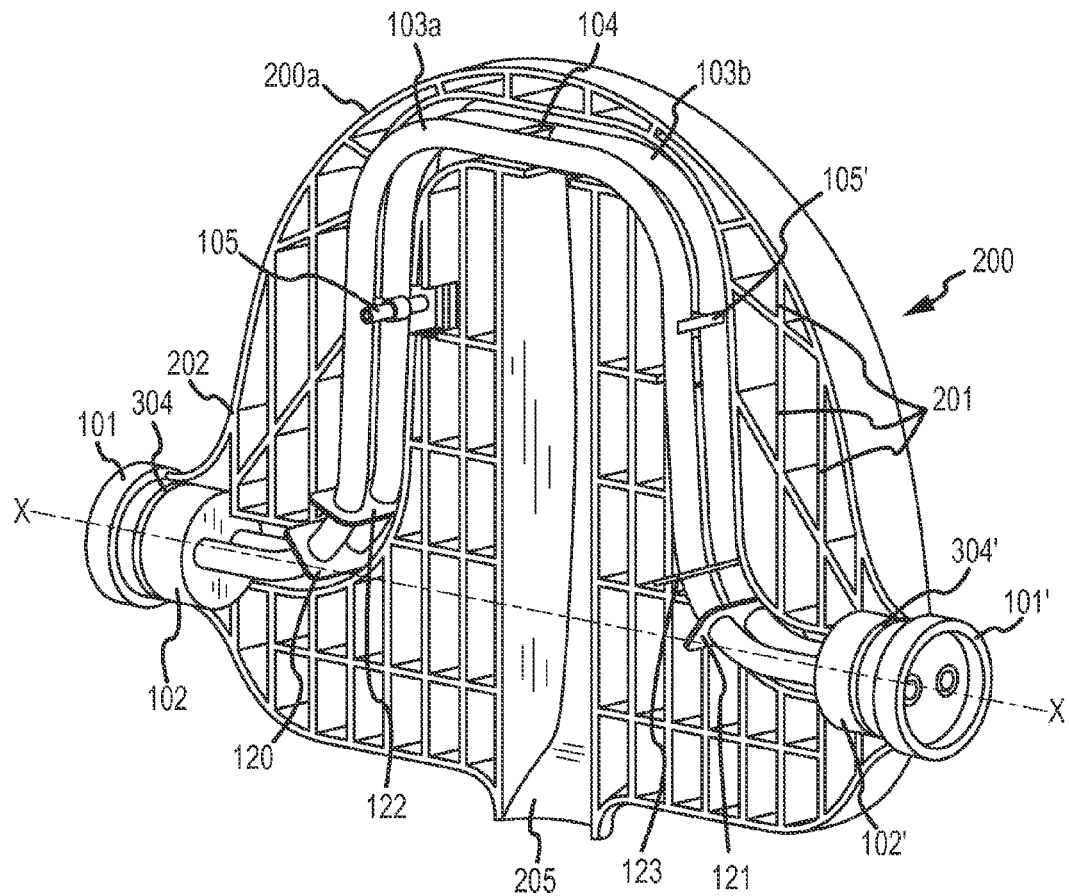
FIG. 3 shows the vibrating meter positioned within a portion of the case according to an embodiment of the invention.

FIG. 3 shows the vibrating meter 5 including the case 200 according to an embodiment of the invention. As shown in FIG. 3, the case 200 can be coupled to the manifolds 102, 102', respectively. Because the manifolds 102, 102' are also coupled to the conduits 103A, 103B, vibrations of the case 200 can easily be experienced by the conduits 103A, 103B and interfere with the meter measurements. The manifolds 102, 102' may be coupled to the manifold openings 203, 203' of the case 200 according to known methods including, but not limited to, adhesives, brazing, bonding, mechanical fasteners, etc.

Further shown in FIG. 3 are sealing members 304, 304'. The sealing members 304, 304' may be coupled to the manifolds 102, 102', respectively. When the sensor assembly 10 is positioned within the case 200, the sealing members 304, 304' can be received by the grooves 204, 204', for example. The sealing members 304, 304' may provide a substantially fluid-tight seal between the manifolds 102, 102' and the manifold openings 203, 203'. In some embodiments, the substantially fluid-tight seal between the manifolds 102, 102' and the manifold openings 203, 203' may provide the necessary coupling to hold the sensor assembly 10 in place within the case 200. In addition, in many embodiments, the manifolds 102, 102' may be formed from a material similar to the first material, i.e., metal while the case 200 is formed from the second material, i.e., plastic. In addition to the first and second materials comprising substantially different vibrational damping characteristics, the first and second materials may also comprise substantially different thermal properties. For example, the first and second materials may comprise different thermal coefficients of expansion. Therefore, in some embodiments, the sealing members 304, 304' may comprise rubber O-rings or the like, which can accommodate different thermal expansions when the conduits 103A, 103B and the case 200 are subjected to changing temperatures. Therefore, in some embodiments, the sealing members 304, 304' may comprise a highly damped material, such as a rubber O-ring, and may provide additional vibration separation between the conduits 103A, 103B and the case 200 as well as thermal compensation to relieve thermal stress between the conduits 103A, 103B and the case 200.

According to an embodiment of the invention, the sealing members 304, 304' may be configured to allow the manifold 102, 102' to rotate about their common axis X while substantially preventing motion in directions perpendicular to the common axis X. This restriction in lateral movement can substantially reduce potential damage to the flanges 101, 101' and other existing equipment.

As shown in FIG. 3, the driver 104 is positioned proximate the feed thru opening 205. The leads 100 can therefore, easily extend from the case 200 through the feed thru opening 205.

Figure 4:
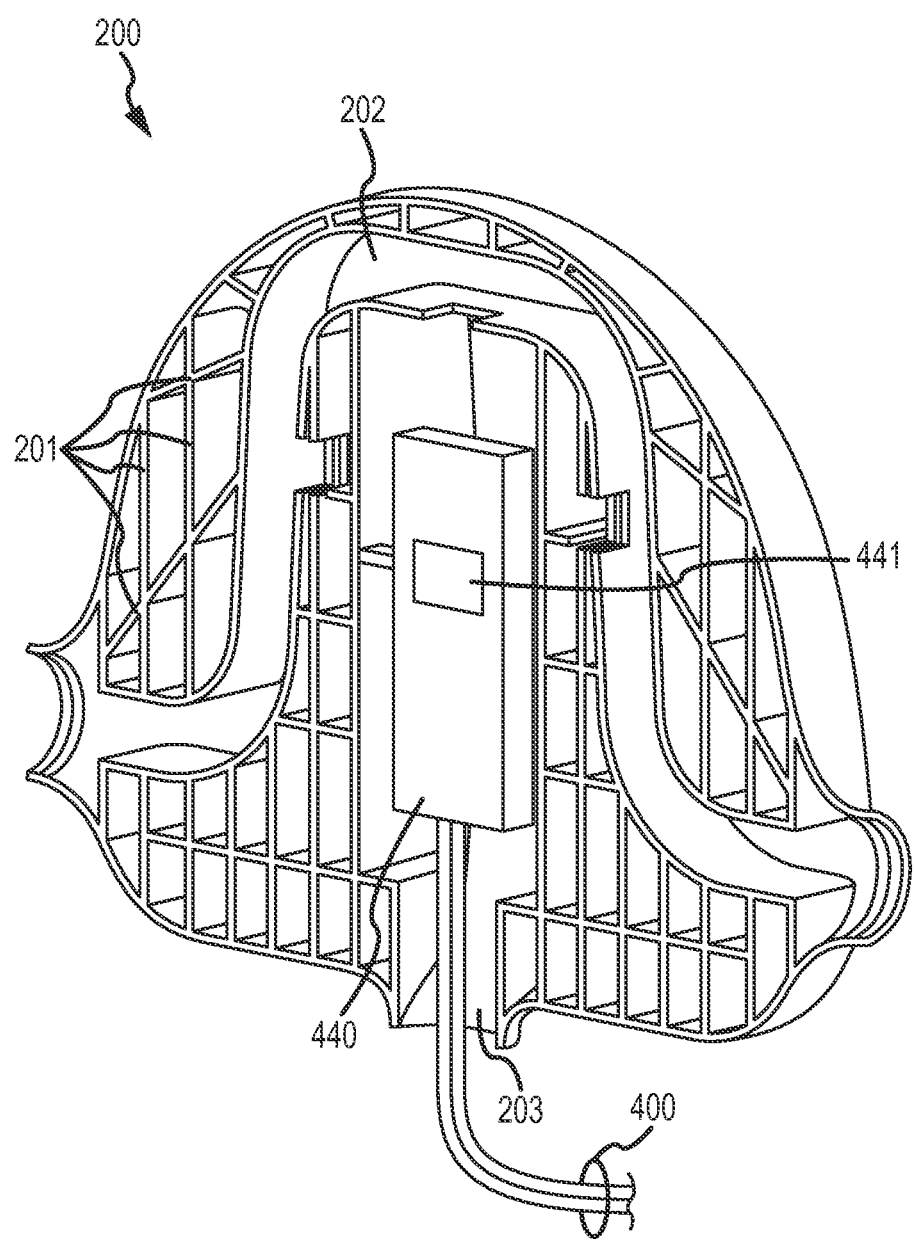
FIG. 4 shows a portion of a case for the vibrating meter according to another embodiment of the invention.

FIG. 4 shows the case 200 according to another embodiment of the invention. The embodiment shown in FIG. 4 is similar to the previously described embodiments; however, FIG. 4 shows a printed circuit board (PCB) 440. The PCB 440 can be coupled to a portion of the case 200 and held substantially stationary. The PCB 440 may be provided to communicate a drive signal to the driver 104, communicate a pick-off signal from the pick-off sensors 105, 105', or both. In addition, electrical leads 400 may be coupled to the PCB 440 and communicate with the meter electronics 20, for example. While three leads are shown, it should be appreciated that any number of leads may be provided.

According to an embodiment of the invention, the PCB 440 may also include a display 441. The display 441 may be provided to display various operator parameters and/or settings of the vibrating meter 5. In some examples, the case 200 may include a transparent portion (See FIG. 5) that allows a user to see the display 441 without requiring removal of the case 200.

Figure 5:
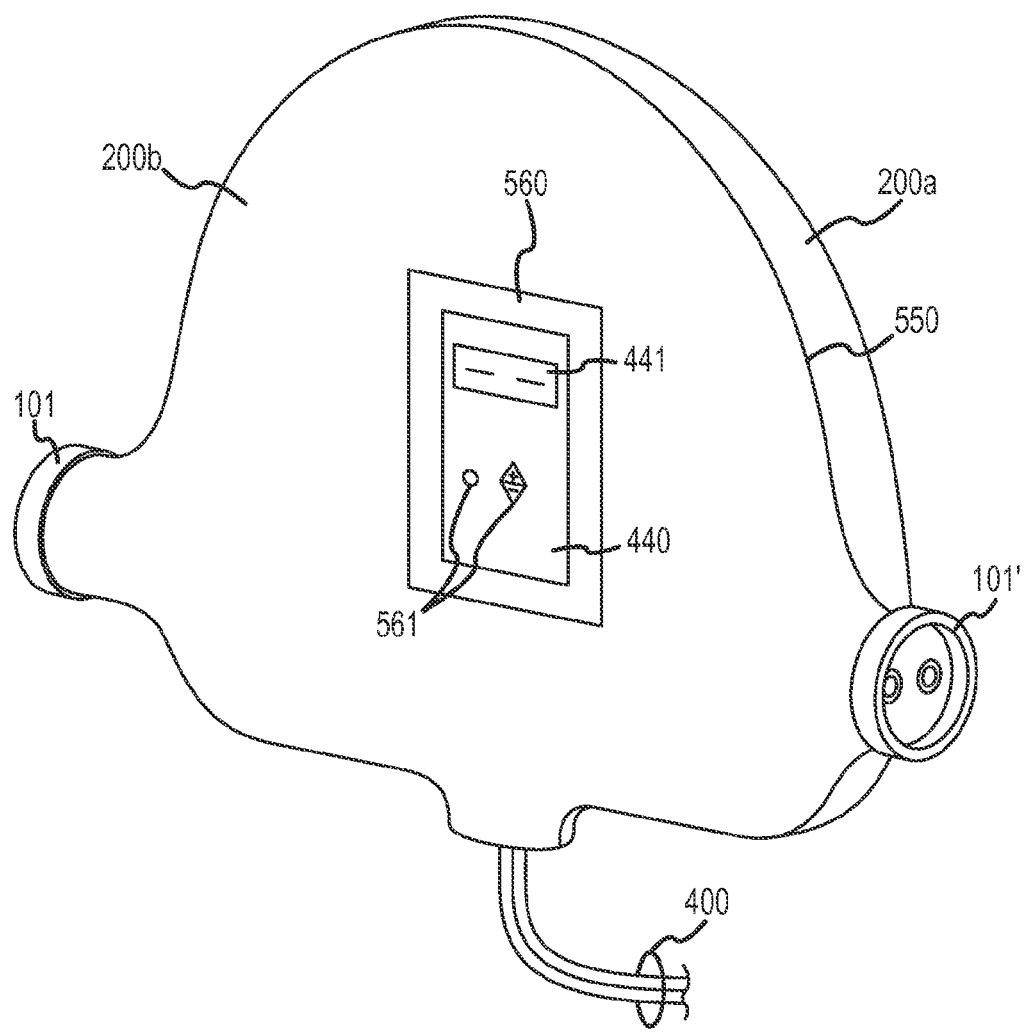
FIG. 5 shows the case enclosing the sensor assembly according to an embodiment of the invention.

FIG. 5 shows the case 200 substantially surrounding a portion of the vibrating meter 5 according to an embodiment of the invention. In the embodiment shown, the case 200 comprises the transparent portion 560. It should be appreciated that in other embodiments, substantially the entire case 200 can be formed from a transparent material. As mentioned above, the transparent portion 560 may be provided to view the display 441 located within the case 200. In some embodiments, the transparent portion 560 may include partially deformable portions that allow a user or operator to access one or more push buttons 561, provided on the PCB 400 for example. The push buttons 561 may allow a user or operator to change, adjust, or view various settings of the vibrating meter 5.

As can be seen in FIG. 5, with the two or more portions 200a, 200b coupled, the case 200 substantially encloses a portion of the sensor assembly 10. The only portions extending from the case 200 are the flanges 101, 101'. It should be appreciated that the embodiment shown in FIG. 5 is merely one example, and in other embodiments, more or less of the sensor assembly 10 may extend from the assembled case 200.

Also extending from the case 200 are the leads 400 that communicate with the PCB 440. The leads 400 may communicate with the meter electronics 20 while the leads 100 previously described may provide communication between the PCB 440 and the driver 104 and pick-offs 105, 105'.

Figure 6:
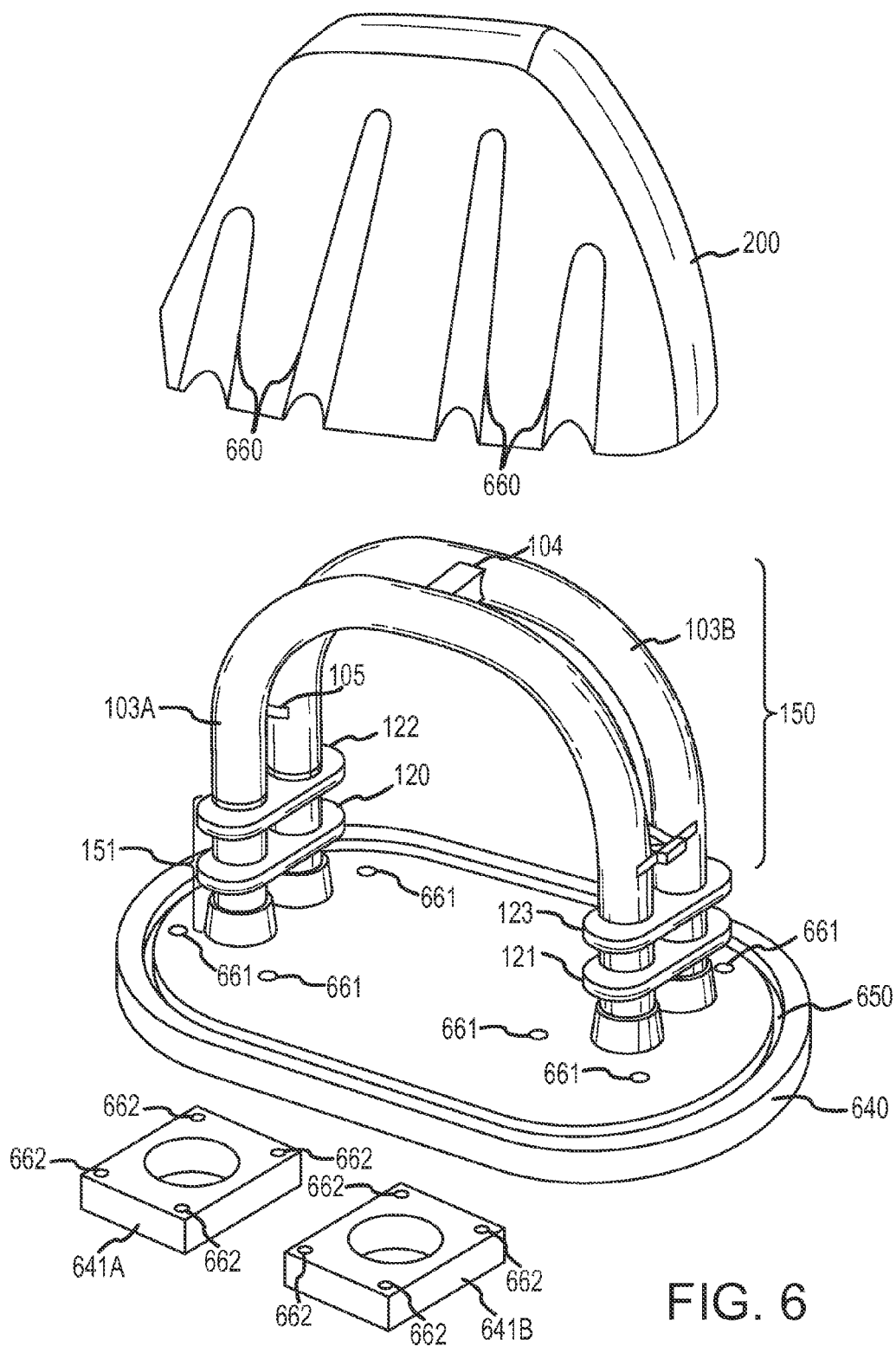
FIG. 6 shows a partially exploded view of the vibrating meter according to an embodiment of the invention.

FIG. 6 shows a partially exploded view of the vibrating meter 5 according to another embodiment of the invention. In the embodiment shown in FIG. 6, the conduits 103A, 103B are coupled to a base 640. According to an embodiment of the invention, the base 640 is further coupled to mounting blocks 641A, 641B. The mounting blocks 641A, 641B may provide a means for attaching the base 640 to the process line (not shown) or a manifold (not shown).

According to the embodiment of FIG. 6, the case 200 is formed from a single portion rather than providing multiple portions. The case 200 is further coupled to the base 640. As shown in FIG. 6, the case 200 includes a plurality of detents 660. The detents 660 are provided in order to accommodate mechanical fasteners (not shown). The mechanical fasteners can fit within the detents 660 and engage the apertures 661 formed in the base 640 and the apertures 662 formed in the mounting blocks 641A, 641B. According to an embodiment of the invention, the mechanical fasteners may comprise U-bolts, for example that fit over the case 200.

According to an embodiment of the invention, the vibrating meter 5 can also include a sealing member 650 positioned between the case 200 and the base 640. The sealing member 650 can comprise a rubber O-ring, for example. According to an embodiment of the invention, the sealing member 650 can be provided to further isolate unwanted vibrations of the case 200 from the conduits 103A, 103B. Further, the sealing member 650 can provide a substantially fluid-tight seal between the case 200 and the base 640.

According to an embodiment of the invention, in addition to the case 200 being formed from the second material that is substantially different from the material used to form the conduits 103A, 103B, the base 640 and/or the mounting blocks 641A, 641B may be formed from the second material. Alternatively, the base 640 and/or the mounting blocks 641A, 641B may be formed from a third material that is different from both the first and second materials. According to an embodiment of the invention, the third material may comprise a material that exhibits higher vibrational damping characteristics than the first material. Therefore, vibrational frequencies that induce a mode of vibration in the base 640 or the mounting blocks 641A, 641B may be substantially lower than the drive frequency. Advantageously, like the case 200, unwanted vibrations from the base 640 and the mounting blocks 641A, 641B are substantially reduced.

According to an embodiment of the invention, the case 200 is formed such that a frequency separation between a frequency that induces a mode of vibration in the case and the drive mode frequency is greater than 1 Hertz. More preferably, the frequency separation is greater than 3-5 Hertz based on the anticipated fluid densities. In some embodiments, the case 200 may be formed in order to maintain sufficient frequency separation for a range of fluid densities. For example, the resonant frequencies of the case 200 may remain below the drive mode frequency even during multi-phase flow. The degree of frequency separation can be adjusted based on the specific material used for the case 200 and/or the specific configuration of the case 200.

It should be appreciated that while the case 200 is used as an example, other meter components exclusive of the vibrating portion 150 of the conduits 103A, 103B, the driver 104, and the pick-offs 105, 105' can likewise be formed from the second material in order separate the resonant frequencies of the meter components from the anticipated drive frequency. Therefore, the present invention should not be limited to the case 200 being formed from the second material that exhibits higher vibrational damping characteristics than the first material used to form the vibrating portion of the conduits 103A, 103B.

The present invention as described above provides a vibrating meter with improved measurement capabilities. Prior art vibrating meters are consistently faced with measurement problems caused by vibration overlaps between the drive mode frequency and a frequency that induces a mode of vibration in a meter case. In contrast, the present invention provides a vibrating meter with an improved meter case. The improved vibrating meter provides conduits formed from a first material and a case formed from a second material. The second material comprises vibrational damping characteristics that are different from the first material. Specifically, the second material exhibits higher vibrational damping characteristics than the first material. Consequently, the various resonant frequencies that induce a mode of vibration in the meter case formed from the second material is substantially reduced and separated away from the anticipated drive mode frequencies. As a result, the vibrating meter of the present invention is not faced with the vibration overlap that typically plagues prior art meters.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein can be applied to other vibrating systems, and not just to the embodiments described above and shown in the accompanying figures. Accordingly, the scope of the invention should be determined from the following claims.

We claim:

1. A vibrating meter (5), comprising:
   one or more conduits (103A, 103B) formed from a first material;
   a driver (104) coupled to a conduit of the one or more conduits (103A, 103B) and configured to vibrate at least a portion of the conduit at one or more drive frequencies;
   one or more pick-offs (105, 105') coupled to a conduit of the one or more conduits (103A, 103B) and configured to detect a motion of the vibrating portion (150) of the conduit; and
   a case (200) enclosing at least a portion of the one or more conduits (103A, 103B), the driver (104) and the one or more pick-offs (105, 105') and formed from a second material, wherein the second material comprises a higher vibrational damping characteristic than the first material, wherein resonant frequencies of the case are reduced and separated away from the one or more drive mode frequencies based on said higher vibrational damping characteristic of said second material.

2. The vibrating meter (5) of claim 1, wherein the case (200) further comprises a plurality of ribs (201).

3. The vibrating meter (5) of claim 1, wherein the case further comprises a conduit opening (203).

4. The vibrating meter (5) of claim 1, wherein the case (200) further comprises a feed thru opening (205) for one or more electrical leads (100).

5. The vibrating meter (5) of claim 1, further comprising a base 640 coupled to the case (200), wherein the base 640 is formed from the second material.

6. The vibrating meter (5) of claim 1, wherein the first material is a metal and the second material is a plastic.

7. The vibrating meter (5) of claim 1, further comprising one or more manifolds (102, 102') coupled to the one or more conduits (103A, 103B) and one or more manifold openings (203, 203') formed in the case (200) and adapted to receive the one or more manifolds (102, 102').

8. The vibrating meter (5) of claim 7, further comprising a groove (204, 204') formed in each of the one or more manifold openings (203, 203') and configured to receive a sealing member (304, 304') coupled to each of the one or more manifolds (102, 102').

9. The vibrating meter (5) of claim 1, further comprising a rupture point (215) formed in the case (200) and adapted to fail at a predetermined pressure.

10. The vibrating meter (5) of claim 1, wherein at least a portion (560) of the case (200) is transparent.

11. A method of forming a vibrating meter including one or more conduits formed from a first material, comprising steps of:
coupling a driver to a conduit of the one or more conduits, the driver being configured to vibrate at least a portion of the conduit at one or more drive frequencies;
coupling one or more pick-offs to a conduit of the one or more conduits, the one or more pick-offs being configured to detect a motion of the vibrating portion of the conduit; and
enclosing at least a portion of the one or more conduits, the driver, and the one or more pick-offs with a case formed from a second material, wherein the second material comprises a higher vibrational damping characteristic than the first material, wherein resonant frequencies of the case are reduced and separated away from the one or more drive mode frequencies based on said higher vibrational damping characteristic of said second material.

12. The method of claim 11, further comprising a step of forming a plurality of ribs in the case.

13. The method of claim 12, further comprising a step of forming a conduit opening.

14. The method of claim 11, further comprising a step of forming a feed thru opening for one or more electrical leads in the case.

15. The method of claim 11, further comprising steps of coupling a base to the case, wherein the base is formed from the second material.

16. The method of claim 11, wherein the first material is a metal and the second material is a plastic.

17. The method of claim 11, wherein the case includes one or more manifold openings adapted to receive one or more manifolds coupled to the one or more conduits and the method further comprises steps of coupling a sealing member to each of the manifolds and inserting a sealing member into a groove formed in each of the manifold openings formed in the case.

18. The method of claim 11, further comprising a step of forming a rupture point in the case that is adapted to fail at a predetermined pressure.

19. The method of claim 11, further comprising a step of forming at least a portion of the case transparent.

* * * * *